United States Patent [19]

Morimoto et al.

[11] Patent Number: 4,523,211
[45] Date of Patent: Jun. 11, 1985

[54] SEMICONDUCTOR DEVICE

[75] Inventors: Kiyoshi Morimoto, Mobara; Toshinori Takagi, Nagaokakyo, both of Japan

[73] Assignee: Futaba Denshi Kogyo Kabushiki Kaisha, Mobara, Japan

[21] Appl. No.: 473,243

[22] Filed: Mar. 8, 1983

[30] Foreign Application Priority Data

Mar. 16, 1982 [JP] Japan .................................. 57-40309

[51] Int. Cl.³ .......................................... H01L 27/12
[52] U.S. Cl. ........................................ 357/4; 357/49
[58] Field of Search ...................................... 357/4, 49

[56] References Cited

U.S. PATENT DOCUMENTS

| 3,743,552 | 7/1973 | Fa | 357/49 X |
| 3,792,525 | 2/1974 | McKinnon | 357/49 X |
| 3,997,381 | 12/1976 | Wanlass | 357/49 X |
| 4,106,045 | 8/1978 | Nishi | 357/4 X |
| 4,381,201 | 2/1983 | Sakyrai | 357/49 X |

Primary Examiner—Martin H. Edlow
Attorney, Agent, or Firm—Oblon, Fisher, Spivak, McClelland & Maier

[57] ABSTRACT

A semiconductor device having multi-layered structure is disclosed. The semiconductor device comprises a first semiconductor layer, a second semiconductor layer, a beryllium oxide (BeO) film for insulating between the first and second semiconductor layers, wherein at least one of the semiconductor layers is grown on the BeO film to be regulated by the crystalline structure of the beryllium oxide.

17 Claims, 14 Drawing Figures

RHEED pattern of BeO film
grown on a Si(111) substrate

SEMICONDUCTOR DEVICE

BACKGROUND OF THE INVENTION

1. Field of the Invention:

This invention relates to a semiconductor device, and more particularly to a semiconductor device having a multi-layered structure which permits a high density packaging by laminating semiconductor layers three-dimensionally into which semiconductor elements are fabricated.

2. Description of the Prior Art:

In light of the recent tendency of high integration of semiconductor elements, a study has been made to produce a single semiconductor device which permits a three-dimentional package of the semiconductor elements by laminating semiconductor chips or layers one upon another. In order to produce such a semiconductor device, problems inherent in its structure must be solved.

One of the problems is to form a semiconductor layer having crystallinity, which is sufficient enough to fabricate the semiconductor elements, upon an insulating layer for insulating between semiconductor layers. This is due to the fact that the semiconductor layer which is excellent in the crystalline state can not grow on the insulating layer deposited on a semiconductor substrate having irregular surfaces due to the formation of the semiconductor elements, because the insulating layer thus deposited is of no definite surface structure. Therefore, the semiconductor elements of superior characteristics can not be formed on the semiconductor layer deposited on such an insulating layer.

Another problem is how to insulate between the semiconductor layers and how to increase heat radiation characteristics of the semiconductor device. In general, a dielectric material is inferior in terms of heat transfer characteristics, and electrical insulation is inversely proportional to the heat radiation characteristics. Thus, the improvement of both the insulation and heat transfer characteristics makes it possible to enhance a degree of high integration and high density package of the semiconductor elements.

There are known two methods for laminating the semiconductors in three dimensions. One is to laminate element semiconductor wafers one upon another. The other is to form multi layers by thin film technology. Among these two methods, the thin film technology is appealing, because there is possibility of increasing the degree of the integration. However, conventional thin film technology is not effective to produce a semiconductor of excellent crystallinity and new developments have yet been put to practical use for producing such a semiconductor.

Thus, there still remains a need for a semiconductor device having good crystalline properties, excellent electrical insulation and heat radiation characteristics which can be produced with low cost materials.

Accordingly, it is an object of the present invention to provide a semiconductor device of multilayered structure which is excellent in the crystalline state and semiconductor characteristics.

It is another object of the present invention to provide a semiconductor device of multilayer three dimensional structure having excellent electrical insulation and heat radiation characteristics while permitting the fabrication of semiconductor elements in a high density arrangement in each of the semiconductor layers to remarkably increase the degree of integration of the semiconductor elements in the device.

It is still a further object of the present invention to provide a semiconductor device which can be produced at a low cost by using a substrate made of an inexpensive material, such as glass or the like.

Other objects, advantages and features of the present invention will become apparent to those skilled in the art from the following discussion and that following the description of the drawings.

Briefly, the foregoing and other objects are attained by providing a three dimensional semiconductor device which comprises a first semiconductor layer, a second semiconductor layer, and a beryllium oxide (BeO) film for insulating between the first and second semiconductor layers, wherein at least one of the semiconductor layers is grown on the BeO film to be regulated by a crystal structure of the beryllium oxide.

Having generally described the invention, a more complete understanding can be obtained by reference to the drawings which are provided herein for purposes of illustration only, and are not intended to be limiting unless otherwise specified.

Having now briefly described the drawings, a more complete understanding of the invention can be obtained by reference to the description of the preferred embodiments which is provided herein for purposes of illustration only, and are not intended to be limiting unless otherwise specified.

DESCRIPTION OF THE PREFERRED EMBODIMENTS

Accordingly semiconductor device according to the present invention will now be described in connection with the drawings. First, reference will be made to a crystalline BeO film which is the essential part of the present invention.

Beryllium oxide (BeO) crystallizes in a hexagonal wurtzite structure and has excellent insulating characteristics, because of its large forbidden band gap of 11.2 eV and its resistivity of $10^{12}$–$10^{13}$ $\Omega$.cm. In addition, the thermal conductivity of BeO (4.2 W/C.cm) which is equivalent to that of metal aluminum, is chemically stable. Due to its optimal characteristics BeO has been extensively used, for example, in electric parts for microwave appliances, as an inner liner for high temperature combustion chambers, as a moderator or reflector in nuclear reactors, and as a window of an X-ray tube. However, BeO has an extremely high melting point of 2,570° C. and is considered to be difficult to form in a thin film.

The inventors noted the excellent characteristics of BeO and conducted extensive research to obtain a beryllium oxide film. As a result, a transparent crystalline beryllium oxide film can now be fabricated at a substrate temperature of no more than 400° C. by a process of film formation of BeO (melting point of 2540° C.) using ion beam technology. U.S. patent application Ser. No. 403,151 filed July 29, 1982 which is continuation of application Ser. No. 168,103 filed July 14, 1980 relates to the beryllium oxide film and the method of producing the same developed by the inventors.

According to the method of producing BeO film developed by the inventors the BeO film crystallizes to be preferentially oriented in the direction of the C-axis which is peculiar to a hexagonal crystalline structure even if an amorphous material such as glass is used as a substrate. When a sapphire or silicon substrate is used, the BeO film is epitaxially grown on the (0001) plane of the sapphire substrate or the (111) plane of the silicon substrate to be regulated by its crystal axis.

The present invention is directed to a semiconductor device which is made of thin films which are laminated three dimensionally so as to have a multi-layered structure. The semiconductor device of the present invention includes the BeO film proposed by the inventors which is either preferentially oriented to the C-axis or single crystal and a semiconductor thin film such as Si, GaAs and the like grown on the BeO film to be regulated by the crystalline state of the BeO film. Reference will now be made to embodiments of the semiconductor device according to the present invention.

Figure 1:
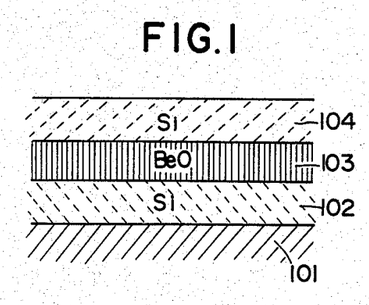
FIG. 1 is a schematical sectional view of a semiconductor device according to a first embodiment of the present invention.

FIG. 1 shows a semiconductor device according to a first embodiment of the present invention. The basic structure of the semiconductor device of this embodiment comprises a substrate 101 made of an insulating material, such as, for example, glass or ceramics, a lower-semiconductor layer 102 made of a silicon film into which semiconductor elements are fabricated, an insulating layer 103 made of a beryllium oxide (BeO) film, and an upper semiconductor layer 104 into which semiconductor elements are fabricated.

In this instance, each of the layers can be formed in various ways. For example, the lower semiconductor layer 102 having excellent crystallinity is formed on the substrate 101 which is made of a monocrystalline sapphire substrate or monocrystalline semiconductor substrate, such as, for example, Si, GaP, GaAs and the like. Then, the semiconductor elements are fabricated on the lower semiconductor layer 102 by a process for forming the semiconductor elements known in the art. In addition, the BeO film 103 as an insulating layer is deposited on the lower semiconductor layer 102 by an ion beam deposition process and the upper semiconductor layer 104 is grown on the BeO film by making use of the orientation of C-axis of the BeO film. The preferential orientation of C-axis of the BeO film is extremely high and crystal growth of such a high quality BeO film can be achieved by a cluster ion beam deposition process developed by the inventors. The crystal growth of the BeO film can be effected on an amorphous substrate to be highly oriented to the C-axis. Therefore, it can be grown on the lower semiconductor layer 102 into which the semiconductor elements such as integrated circuits have been already fabricated, and then the upper semiconductor layer 104 may be grown on the BeO film by making use of its crystallinity.

In a positive alternating method of producing the semiconductor device having the structure as shown in FIG. 1, the substrate 101 may be made of a substance whose cleavage plane can be easily obtained and which can be easily dissolved in water, for example, rock salt. The lower semiconductor layer 102, the beryllium oxide insulating layer 103, and the upper semiconductor layer 104 are deposited in this sequence on a surface of the substrate 101 by an ion beam deposition process or cluster ion beam deposition process. Then, the substrate 101 is dissolved so that the lower semiconductor layer 102 may be exposed for fabricating the semiconductor elements on the exposed surface of the semiconductor layer 102. In this embodiment, the upper semiconductor layer 104 is formed by growing the monocrystalline silicon film. It is to be understood that semiconductors of which lattice constant is relatively close to that of the beryllium oxide, such as, for example, GaAs, GaSb, GaP, InSb and the like can be used in place of silicon.

Figure 2:
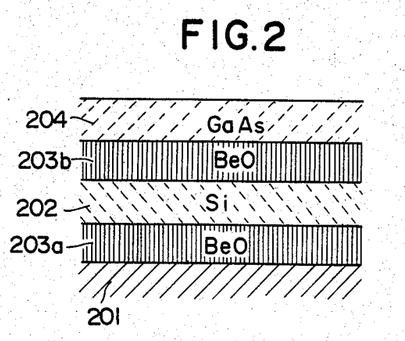
FIG. 2 is a schematical sectional view of a semiconductor device according to a second embodiment of the present invention.

FIG. 2 shows a semiconductor device according to a second embodiment of the present invention. In this embodiment, the semiconductor device comprises a substrate 201, a first insulating layer 203a, a lower semiconductor layer 202, a second insulating layer 203b and an upper semiconductor layer 204. The substrate 201 is made of either glass or metal. In the later case, the substrate 201 can be used as a cooling plate. The first insulating layer 203a is made of a beryllium oxide (BeO) film having orientation to the C-axis and deposited on a surface of the substrate 201 by an ion beam deposition process. The lower semiconductor layer 202 deposited on an upper surface of the first insulating layer 203a is made of a monocrystalline silicon film which is grown to be regulated by the crystalline structure of BeO by using the ion beam deposition process. The second insulating layer 203b deposited on an upper surface of the second insulating layer 203b is made of a beryllium oxide (BeO) film which is formed by the ion beam deposition process. The upper semiconductor layer 204 deposited on the second insulating layer 203b is made of a GaAs film which is grown to be regulated by the crystalline structure of BeO by using the ion beam deposition process. In the semiconductor device according to the second embodiment of the present invention, the substrate 201 may be made of any suitable insulating or conductive material.

Figure 3:
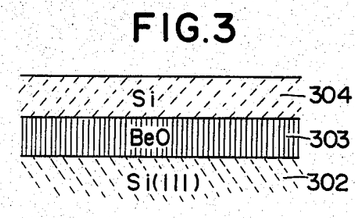
FIG. 3 is a schematical sectional view of a semiconductor device according to a third embodiment of the present invention.

FIG. 3 shows a semiconductor device according to a third embodiment of the present invention. In this embodiment, the semiconductor device comprises a lower semiconductor layer 302 made of a monocrystalline silicon semiconductor wafer, an insulating layer 303 made of a beryllium oxide (BeO) film which is deposited on the (111) plane of monocrystalline silicon by an ion beam deposition process as in each of the embodiments explained hereinabove and an upper semiconductor layer 304 made of a silicon film which is deposited on an upper surface of the insulating layer 303.

Figure 4:
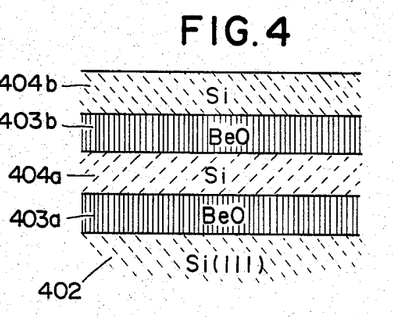
FIG. 4 is a schematical sectional view of a semiconductor device according to a fourth embodiment of the present invention.

FIG. 4 shows a semiconductor device according to a fourth embodiment of the present invention. In this embodiment, the semiconductor device comprises a lower semiconductor layer 402 made of a monocrystalline silicon semiconductor wafer, a first insulating layer 403a made of a beryllium oxide (BeO) film which is deposited on the monocrystalline silicon semiconductor wafer by an ion beam deposition process as in each of the embodiments explained hereinabove and a first upper semiconductor layer 404a made of a silicon film which is deposited on the first insulating layer 403a. In addition, the semiconductor device shown in FIG. 4 includes a second insulating layer 403b made of a beryllium oxide (BeO) film which is deposited on an upper surface of the first semiconductor layer 404a and a second upper semiconductor layer 404b which is deposited on an upper surface of the second insulating layer 403b. In the semiconductor device according to the fourth embodiment of the present invention, it is possible to remarkably increase the degree of integration, because there are three semiconductor layers into which semiconductor elements are fabricated.

Figure 5:
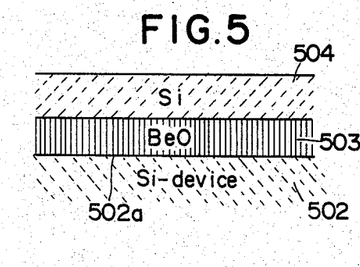
FIG. 5 is a schematical sectional view of a semiconductor device according to a fifth embodiment of the present invention.

As explained hereinabove, the BeO film can grow on the uneven surface to be highly orientated to the C-axis. Thus, the semiconductor elements can be fabricated on both the front and reverse sides of the wafer. This makes it possible to fabricate a semiconductor device as shown in FIG. 5 which comprises a lower semiconductor layer 502 made of a monocrystalline silicon semiconductor wafer in which integrated circuits and the like are fabricated on its surface 502a, an insulating layer 503 which is made of a beryllium oxide film and formed on an upper surface of the lower semiconductor layer 502 by an ion beam deposition process as in each of the embodiments explained hereinabove, and an upper semiconductor layer 504 deposited on the insulating layer 503 in which integrated circuits and the like are fabricated.

In the semiconductor device according to the present invention, the BeO film growing on the substrate is not necessarily single. During the deposition of the BeO film, a metal film may be deposited on the BeO film, which promotes heat transfer from the BeO film so as to radiate heat through the metal film. This metal film may be used as a shield between the elements of the respective layers. The metal film is deposited thereon an additional BeO film on which a semiconductor is formed.

The semiconductor device according to this embodiment will be explained in connection with FIG. 6.

Figure 6:
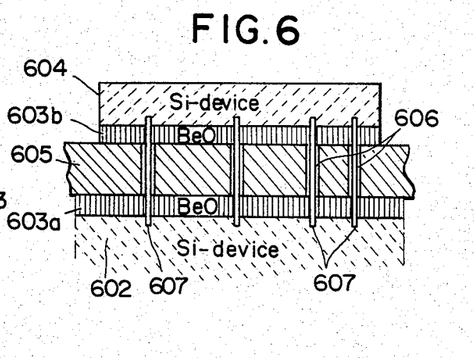
FIG. 6 is a schematical sectional view of a semiconductor device according to a sixth embodiment of the present invention.

The semiconductor device according to a sixth embodiment of the present invention shown in FIG. 6 comprises a lower semiconductor layer 602 in which semiconductor elements are fabricated, a first insulating layer 603a which is made of a beryllium oxide (BeO) film and formed on the lower semiconductor layer 602, a substrate 605 which is made of metallic or magnetic material and deposited on the first insulating layer 603a, a second insulating layer 603b which is made of the BeO film and deposited on the substrate, and an upper semiconductor layer 604 which is deposited on the second insulating layer 603b. The upper semiconductor layer 604 is provided with integrated circuits and the like and electrically connected to the lower semiconductor layer 602 by means of connectors 607 which pass through holes 606 formed on the substrate 605. The provision of the substrate 605 can promote heat radiation effect. In addition, a static electricity shielding effect can be expected if the substrate is made of the metallic material, whereas a magnetic shield effect can be expected if the substrate is made of the magnetic material.

In each of the embodiments explained hereinabove, the formation of the BeO film and/or the semiconductor layer is made by the ion beam deposition process. It is advisable to use the closure ion beam deposition process proposed by the inventors in order to form the BeO film and/or the semiconductor film which are superior in quality.

The cluster ion beam deposition process comprises the steps of vaporizing substances to be deposited in a crucible having at least one injection nozzle, jetting the vapors from the injection nozzle into a high vacuum region to form atomic groups or clusters under the influence of a supercooling phenomenon caused by the adiabatic expansion of the vapors at the time when they are jetted, subjecting the clusters to electron shower by application of ionized current Ie so that the clusters may be partially ionized to form cluster ions, and accelerating the cluster ions by acceleration voltage (Va) to make them impinge on a substrate together with non-ionized neutral clusters so as to form a thin film thereon. In the cluster ion beam deposition process, energy for impinging the clusters upon the substrate can be controlled by changing the acceleration voltage (Va) of the clusters, because at least a part of the clusters is ionized. Under certain circumstances, the clusters are not required to accelerate and kinetic energy giving to the clusters at the time of jetting from the nozzle is sufficient enough to let the clusters impinge upon the substrate. As a matter of course, the neutral clusters are not accelerated by the acceleration voltage and impinge upon the substrate with the energy given when jetted so as to form the film thereon. In the cluster ion beam deposition process, the crystalline state of the film and other properties can be controlled at will, and the film can be subjected to be amorphous, preferentially oriented to the C-axis, polycrystalline or monocrystalline by controlling the proportion of the ionized clusters to the total clusters for forming the film on the substrate and the kinetic energy for the clusters in association with appropriate substrate temperature Ts. These controls are effected by the ionized current Ie and the acceleration voltage for the clusters. This process can be modified so that low pressure (approx. $10^{-6}$ to $10^{-4}$ Torr) reactive gas, such as, for example, $O_2$, $N_2$, $H_2$ and the like, may be introduced into the system. This is generally known as a reactive cluster ion beam deposition process and adapted for use in forming oxide, nitride, hydride film and the like and controlling properties of the film.

An apparatus for forming the BeO film by the cluster ion beam deposition process will be explained with reference to FIG. 7.

Figure 7:
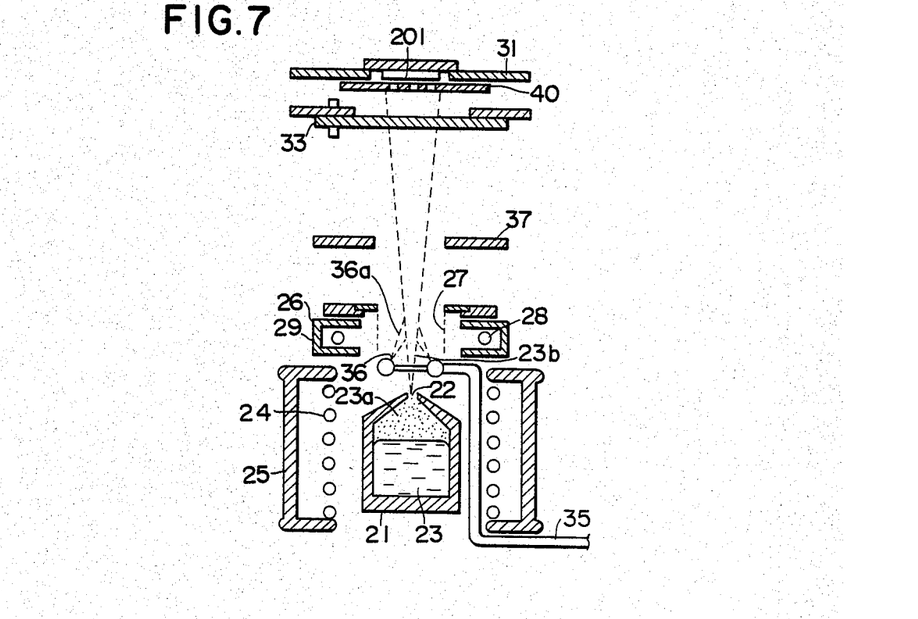
FIG. 7 is a schematic diagram of an embodiment of an apparatus for producing a semiconductor device according to the present invention.

The apparatus shown in FIG. 7 includes a closed type crucible 21 having at least one nozzle 22, which in this example between 0.5 mm and 2.0 mm in diameter. The thickness of the nozzle in the axial direction is as small as possible, preferably thinner than the diameter of the nozzle 22, so that the aspect ratio becomes less than 1. The crucible 21 contains metallic beryllium 23, which is introduced into the crucible in the form of flakes or pellets.

The crucible is surrounded by a heater 24. In the embodiment shown in FIG. 7, the heater 24 operates by electron bombardment, and comprises a coiled filament for emitting electrons. The crucible 21 is maintained at a positive potential relative to the filament, by means of a power source (not shown), thereby accelerating the electrons emitted from the filament so that they impinge upon the crucible surface at high velocity, to produce heating of the crucible 21. A thermal shielding plate 25 surrounds the heater 24. In a possible alternative arrangement for heating the crucible 21, the crucible is made of an electrically conductive material, terminals are provided on upper and lower parts of the crucible 21, and the crucible 21 is then heated by passing a high current (at low voltage) through the crucible 21 so as to heat the entire crucible 21. As a further alternative, the crucible 21 can be heated by radiation heating, with a heater disposed around the crucible 21. A combination of more than one of these heating methods may be used.

An ionization chamber 26, is provided above the crucible 21. Around the ionization chamber, there is provided an arrangement for generating ionizing electrons, comprising a filament 28 enclosed within a shield 29, and a reticular anode 27 forming the outer limits of the ionization chamber. In plan view, the anode 27 is circular, although it may have any of a variety of other shape, such as polygons.

A substrate holder 31 is provided to hold a substrate 201 on the reverse surface of which the BeO film is deposited. Also, a shutter 33 is provided to allow the substrate 201 to be shield from the jets of beryllium oxide and oxygen.

Numeral 35 designates an oxygen supply pipe having at least one nozzle 36. In the embodiment shown in FIG. 7, the nozzle 36 is disposed in the vicinity of the nozzle 22 of the crucible 21, however, the nozzle 36 may be provided adjacent to the substrate 201. An annular acceleration electrode 37 to which a negative potential relative to the crucible 21 is applied by a power source (not shown) for accelerating ionized Be vapors may be provided between the ionization chamber 26 and the substrate 201. There is provided a photomask 40 which is closely contacted to the substrate 201 or maintains a small clearance with respect to the substrate 201 to permit the vapor deposition of the BeO film on predetermined portions of the substrate 201. Also, a heater (not shown) may be provided to maintain the substrate 201 at the correct temperature, if required.

The apparatus shown in FIG. 7 is all enclosed in a vacuum chamber (not shown), together with the substrate 201 on which the beryllium oxide film is to be formed and the chamber is evacuated at a high vacuum state in the order of at least $10^{-5}$ Torr. In this state, oxygen 36a is supplied to the vacuum chamber from the nozzle 36 through the oxygen supply pipe 35, and the pressure within the vacuum chamber is maintained between $10^{-6}$ Torr and $10^{-3}$ Torr. The use of a lower oxygen pressure may lead to the formation of the beryllium oxide film of higher quality. However, the use of a lower oxygen pressure also requires the vacuum chamber to be evacuated to a very high vacuum before the oxygen is introduced, and results in a reduction in the speed at which the film is formed. The range of $10^{-6}$ Torr to $10^{-3}$ Torr provides a reasonably practical compromise between these conflicting requirements.

Then, the heater 24 is actuated to heat the crucible 21 for melting the metal Be filled in the crucible 21 and generating vapor 23a of the metal Be within the crucible 21. The temperature for heating the metal Be is determined based on enviromental space around the crucible 21, namely, the pressure within the vacuum chamber which can be expressed as $P/Po \geq 10^{-2}$, preferably $P/Po \geq 10^{-4}$, in which P represents the vapor pressure of the metal Be within the crucible 21 and Po represents the pressure within the vacuum vessel. For instance, the vapor pressure P is maintained at approximately $5 \times 10^{-2}$ Torr at the heating temperature of 1,300° C. and $1 \times 10^{-1}$ Torr at the heating temperature of 1,380° C., because the melting point of the metal Be is 1,280° C. Accordingly, the heating temperature of 1,300°–1,400° C. is sufficient enough when the pressure with the vacuum vessel is $10^{-6}$ Torr to $10^{-5}$ Torr. In order to speed up the film formation by increasing the vapor pressure P, the heating temperature may be increased within extent of not damaging the quality of the BeO film to be formed.

The vapor 23a of the metal Be is ejected from the nozzle 22 to the outside of the crucible 21 due to the pressure difference between the crucible 21 and the vacuum vessel. The ejected vapor is imparted with kinetic energy corresponding to the ejection velocity and directed toward the substrate 11 in a vapor stream 23b. In this instance, if the vapor is forced into a supercooled state due to the adiabatic expansion at the time of ejecting from the nozzle 22 by changing the shape of the nozzle 22 and the pressure P and Po so as to meet the conditions explained hereinabove, or modifying the shape of the nozzle 22 of the crucible 21, it is possible to have the vapor converted into clusters which are large aggregates of the vapor of Be atoms or moleculars loosely coupled by Van der Waals force. The formation of the clusters makes it possible to improve ionization efficiency in the ionization chamber 26 which will be explained hereinafter and also to form superior films on the substrate 11.

The vapor stream 23b imparted with the kinetic energy due to the ejection from the crucible 1 is passed through the ionization chamber 26 where at least a part of the vapor stream 3b is ionized. The ionization of the vapor 23b is effected in such a manner that electrons emitted from the filament 28 when energized and heated are accelerated at the voltage of 100–1000 V which is applied between the filament 28 and the reticular anode 27 and then impinged upon the vapor stream 23b passing through the reticular anode 27. When the vapor stream 23b of the metal Be spouted from the nozzle 22 is in the form of the clusters, at least one of the atom groups constituting each cluster is ionized in the ionization chamber 6 by the electron bombardment, thereby to form cluster ions. Furthermore, the oxygen spouted from the nozzle 36 is passed through the ionization chamber 26 where the oxygen is subjected to the electron bombardment and partially ionized.

The ionized Be atoms and the non-ionized neutral Be atoms or the Be clusters and the cluster ions, while involving the oxygen in the route of the vapor stream 23b, are directed toward the substrate 201 as an oxygen complex, and, when the shutter is open, the vapor stream 23b is brought into collision with the surface of the substrate 201 through openings of the mask 40 to form a BeO film 41 thereon. In this instance, as explained hereinabove, a part of the Be vapor stream 23b impinging upon the substrate is ionized by passing through the ionization chamber 26, and the electric field of the ion is effectively acted upon the initial state of the film formation. That is, the electric field of the ion promotes the formation of nuclei for the crystal growth and is effectively acted upon the formation of island regions gathering the atoms at the center of the nuclei thus formed which is generally known as a coalescence. Furthermore, the ionization is effective to promote reaction between Be and oxygen and to form the film which is excellent in the crystalline state corresponding to the stoichiometry.

In the formation of the BeO film according to the present invention, the Be vapor stream 23b is impinged on the substrate 201 with the kinetic energy imparted at the time of the ejection. Therefore, highly adhesive deposition of the BeO film 41 on the substrate 201 can be achieved due to the implantation energy, which is, in turn, effective to contribute to the increase in the packing density of the BeO film 41 and the improvement of the crystalline state and to form the film of excellent quality. The ionization rate of the BeO vapor stream 23b can be controlled by adjusting the acceleration voltage applied to the anode 27 and changing the ionization current extracted from the filament 28, thereby to control the crystalline state and other characteristics of the BeO film to be deposited on the substrate.

In the above embodiment, the kinetic energy of the Be vapor stream 23b is generated by ejecting the vapor 23a out of the crucible 21 due to the pressure difference between the crucible 21 and the vacuum chamber. However, it is to be understood that the vapor stream 23b partially ionized by passing through the ionization chamber 26 may be accelerated by an electric field so as to increase the kinetic energy, thereby to control or improve the crystalline state. For instance, if the acceleration voltage of 0-10 KV which is negative with respect to the crucible 1 is applied to the acceleration electrode 37, the particles in the vapor stream 23b ionized by passing through the ionization chamber 26 are accelerated and imparted with the kinetic energy, which is effectively acted upon the improvement or control of the crystalline state at the time of the formation of the film, and the BeO film 41 of high quality can be produced. When it is required to form the BeO film 41 which is extremely excellent in its crystalline state, the substrate 11 must be heated to some extent. The heating temperature of the substrate in this instance may be approximately 200° C. or less than 400° C. This temperature is sufficiently lower than thermal diffusion temperature applied at the time of forming the semiconductor elements on the substrate 201. Therefore, there is no possibility of diffusing unnecessary impurities into the semiconductor elements and damaging impurity atom concentration profile prepared in the semiconductor layers at the time of forming the semiconductor elements.

Reference will now be made to experimental results obtained from the BeO film which is deposited on the substrate by the cluster ion beam deposition process.

Figure 8:
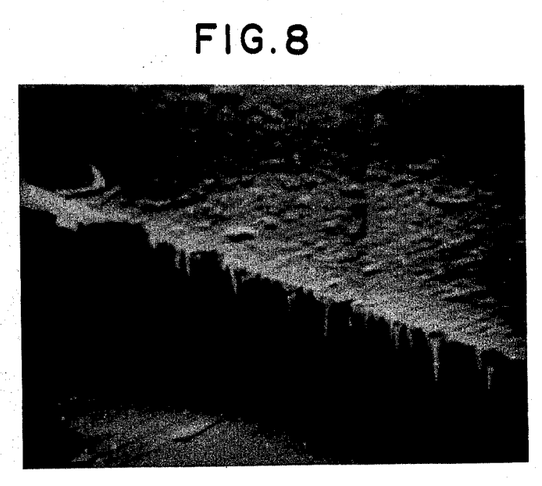
FIG. 8 is an electron micrograph showing a scanning electron microscope (SEM) structure of a beryllium oxide (BeO) film grown on a glass substrate.

FIG. 8 shows an electron micrograph showing a scanning electron microscope (SEM) structure of the cross section of BeO film deposited on the glass substrate under the conditions of the ionization current Ie being 300 mA, the acceleration voltage Va being 0V, and the substrate temperature being 400° C. by the reactive cluster ion beam deposition process which comprises the steps of jetting the BeO vapors from the nozzle 22 into the oxygen atmosphere maintained at approximately $10^{-4}$ Torr to form the BeO clusters. As is apparent from the columnar structure shown in electron micrograph, the BeO film is grown with its C-axis perpendicular to the surface of the substrate. Thus, the ionized cluster ion beam deposition process permits the C-axis oriented BeO film to grow even on the surface of the amorphous substance.

Figure 9:
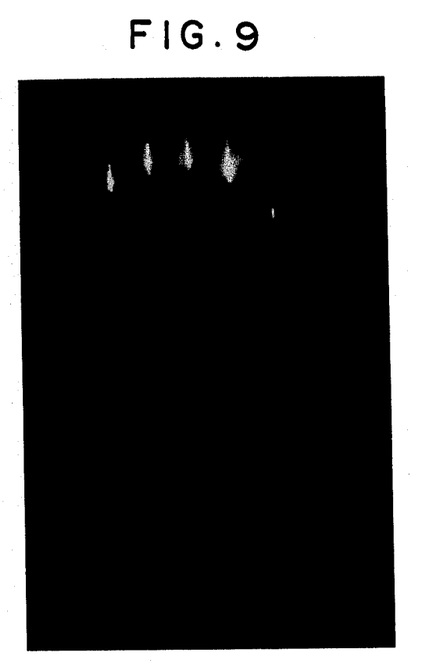
FIG. 9 is an electron micrograph showing a reflective high energy electron diffraction (RHEED) pattern of a beryllium oxide (BeO) film epitaxially grown on the (0001) plane of sapphire substrate.

When a sapphire (0001) substrate is used in stead of the amorphous glass substrate, the BeO film is epitaxially grown on the substrate making the crystal axis as a nucleus as shown in FIG. 9. In this instance, lattice misfit between the lattice constant of BeO (a≃2.95 Å) and the minimum atom bond length of sapphire substrate (2.74 Å) is as small as 1.73%. Therefore, substantially perfect monocrystalline BeO film is grown on the substrate.

Figure 10:
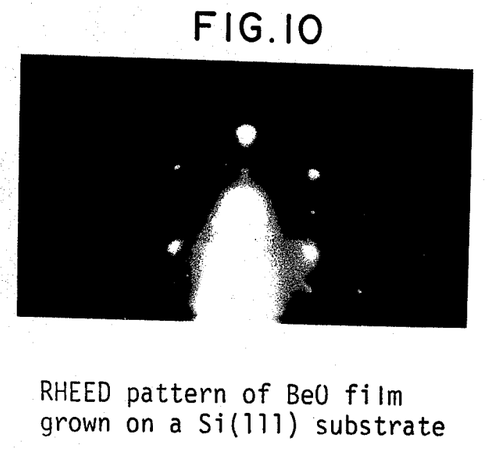
FIG. 10 is an electron micrograph showing a reflective high energy electron diffraction (RHEED) pattern of a beryllium oxide (BeO) film grown on the (111) plane of silicon substrate.
Figure 11:
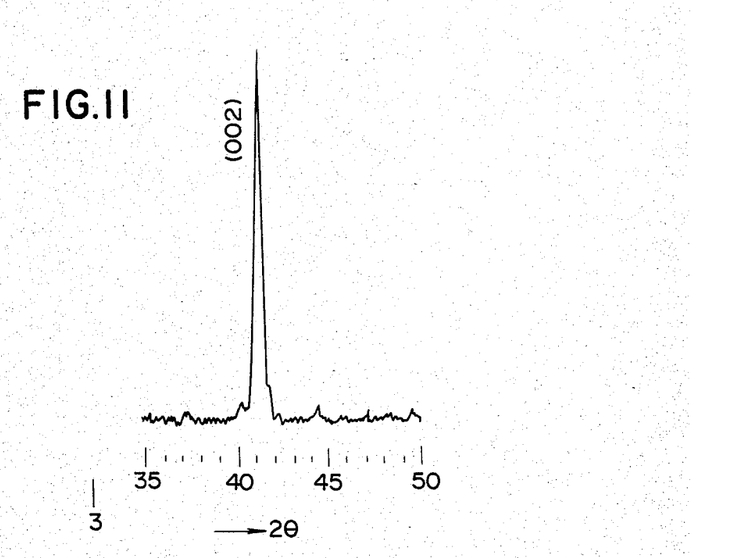
FIG. 11 is an X-ray diffraction pattern of a beryllium oxide (BeO) film grown on the (111) plane of silicon substrate.
Figure 12:
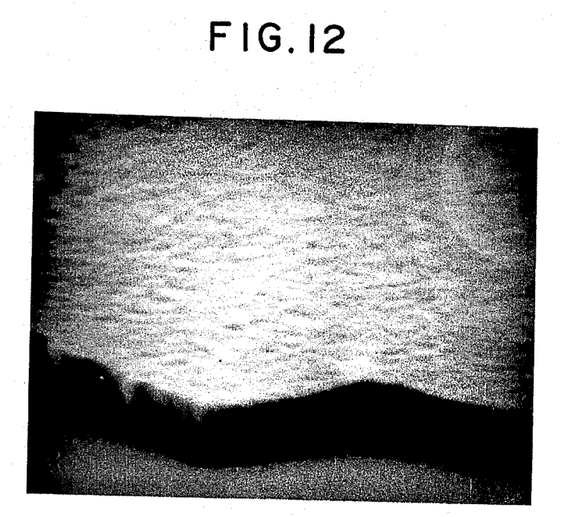
FIG. 12 is an electron micrograph showing a scanning electron microscope (SEM) structure of a beryllium oxide (BeO) film grown on the (111) plane of silicon substrate.

FIG. 10 shows a reflective high energy electron diffraction pattern of the BeO film which is grown on the (111) plane of monocrystalline silicon substrate in stead of the sapphire substrate. FIG. 11 shows an X-ray diffraction pattern of the BeO film and FIG. 12 shows a scanning electron microscope (SEM) structure of the cross section of the BeO film. The condition for growing the BeO film is as follows:

Ionization current Ie≃300 mA
Acceleration voltage Va≃0 V (the BeO clusters are imparted with kinetic energy corresponding to the ejection velocity)
Substrate temperature Ts≃400° C.
Oxygen partial pressure during the deposition being $3 \times 10^{-4}$ Torr In this embodiment, the BeO film is grown with its C-axis, namely <002> axis, perpendicular to the (111) plane of the silicon substrate, although there is lattice misfit of 14.7% between the silicon (111) substrate and the (002) plane of BeO. As is apparent from the experimental results, there is the lattice misfit of ten-odd % between the substrate on which the BeO film is formed and the lattice constant of BeO, which makes it possible to deposit the BeO film on a variety substrate materials.

Reference will now be made to experimental results obtained from the semiconductor layer which is formed on the BeO film by the cluster ion beam deposition process explained hereinabove.

Figure 13:
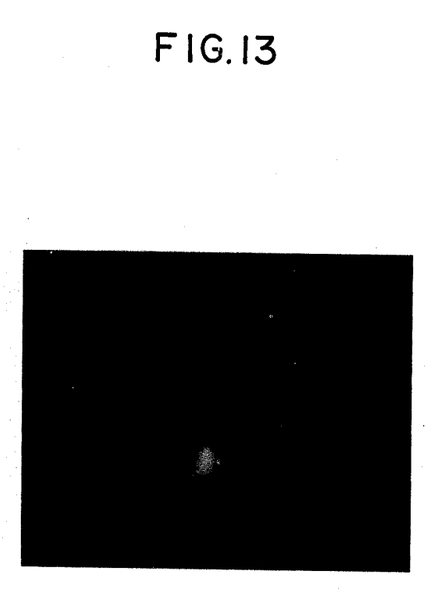
FIG. 13 is an electron micrograph showing a reflective high energy electron diffraction (RHEED) pattern of silicon film grown on a beryllium oxide (BeO) film which is preferentially oriented to the C-axis.

FIG. 13 shows a reflective high energy electron diffraction (RHEED) pattern of the silicon film grown on the BeO film shown in FIG. 8 which is preferentially oriented to the C-axis on the glass substrate. The condition for the deposition is as follows:

Ionization current Ie≃200 mA
Acceleration voltage Va≃5 KV
Substrate temperature Ts≃300° C.

The silicon film is epitaxially grown with its <111> crystal axis making BeO atoms on the (002) plane perpendicular to the C-axis of BeO as a nucleus.

Figure 14:
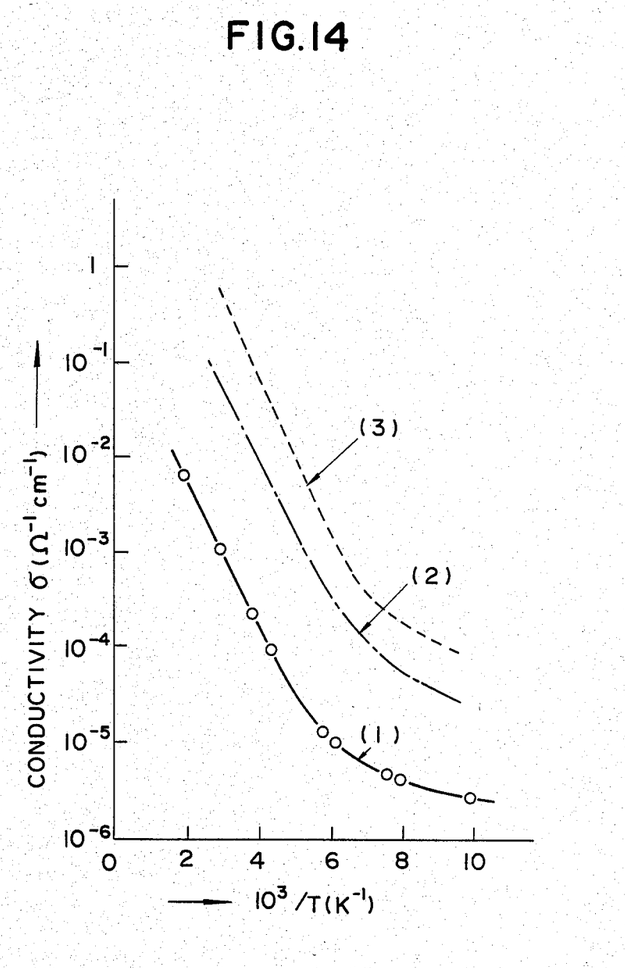
FIG. 14 shows a graph of temperature characteristics of electric conductivity ($\sigma$) of silicon film grown on a preferentially oriented beryllium oxide (BeO) film.

FIG. 14 shows an example of temperature characteristic of the crystal growth silicon film as a function of electric conductivity which is measured within a temperature range of 77 to 300K. The curve (1) represents the temperature characteristic of the silicon film which is grown by using a high purity silicon without containing impurities as a raw material. The curves (2) and (3) each represents the temperature characteristics of the silicon film. In the curve (2), the silicon film is grown on the BeO film by using silicon containing approximately 0.01 wt % of In. In the curve (3), the silicon film is grown on the BeO film by using silicon containing approximately 0.01 wt % of P. In each case, the characteristic is almost equivalent to that obtained from a monocrystalline silicon wafer. The value of Hall mobility of these films is $\mu h \simeq 200$ cm$^2$/V.S in a p-type sample to which is added In and is $\mu e 800$ cm$^2$/V-S in an n-type sample to which is added P. These values are equivalent to those obtained from Si/Si homoepitaxial growth film.

As is apparent from the experimental results, the crystal growth of the silicon on the BeO film which is preferentially oriented to the C-axis and the crystal growth of BeO on the silicon (111) substrate can be controlled by regulating contents of ions during the deposition and the kinetic energy (acceleration voltage). Therefore, if the crystal growth of the silicon or BeO is controlled, the semiconductor device of the multilayered structure according to the first to the sixth embodiment of the present invention can be produced.

Although this invention has been explained with reference to the cluster ion beam deposition process, it is to be understood that the invention is not limited to the cluster ion beam deposition but is practiced by ion beam deposition or ion plating. Accordingly, numerous modifications and variations of the present invention are possible in light of the above teachings. Having now fully described the invention, it will be apparent to one of ordinary skill in the art that many changes and modifications can be made thereto without departing from the spirit or scope of the invention as set forth therein.

What is claimed as new and desired to be secured by Letters Patent of the United States is:

1. A semiconductor device comprising:
   a lower semiconductor layer;
   an electrical insulating layer made of a crystalline beryllium oxide thin film, said electrical insulating layer being deposited on said lower semiconductor layer; and
   an upper semiconductor layer, said upper semiconductor layer being grown on said electrical insulating layer to be regulated by the crystalline structure of beryllium oxide thin film.

2. The semiconductor device as defined in claim 1, wherein said beryllium oxide film is a C-axis oriented film.

3. The semiconductor device as defined in claim 1, wherein each of said lower and upper semiconductor layers comprise fabricated semiconductor elements.

4. The semiconductor device as defined in claim 3, wherein said semiconductor elements are formed on a surface of said lower semiconductor layer, on which semiconductor elements said beryllium oxide film is then deposited.

5. The semiconductor device as defined in claim 1, wherein said lower semiconductor layer is made of a monocrystalline semiconductor wafer.

6. The semiconductor device as defined in claim 1, wherein said lower semiconductor layer is grown on a substrate.

7. A semiconductor device comprising:
   a lower semiconductor layer;
   a first electrical insulating layer made of a crystalline beryllium oxide film; said electrical insulating layer being deposited on said lower semiconductor layer;
   a substrate made of metallic or magnetic material, said substrate being deposited on the first electrical insulating layer;
   a second electrical insulating layer made of a crystalline beryllium oxide thin film, said electrical insulating layer being deposited on said substrate; and
   an upper semiconductor layer, said upper semiconductor layer being grown on said second electrical insulating layer to be regulated by the crystalline structure of beryllium oxide thin film.

8. The semiconductor device as defined in claim 7, wherein said beryllium oxide film is a C-axis oriented film.

9. The semiconductor device as defined in claim 7, wherein each of said lower and upper semiconductor layers independently are fabricated semiconductor elements.

10. The semiconductor device as defined in claim 9, wherein said semiconductor elements are formed on a surface of said lower semiconductor layer on which semiconductors elements said beryllium oxide film is then deposited.

11. The semiconductor device as defined in claim 9, wherein said substrate is provided with holes for permitting conductors for electrically connecting said semiconductor elements formed on said upper and lower semiconductor layers to pass therethrough.

12. The semiconductor device as defined in claim 7, wherein said lower semiconductor layer is made of a monocrystalline semiconductor wafer.

13. The semiconductor device as defined in claim 7, wherein said lower semiconductor is grown on a substrate.

14. The device of claim 1, wherein the lower and upper semiconductor layers independently can be made of a component selected from the group consisting of silicon, GaAs, GaSb, GaP and InSb, or mixtures thereof.

15. The device of claim 7, wherein the lower and upper semiconductor layers independently can be made of a component selected from the group consisting of silicon, GaAs, GaSb, GaP and InSb, or mixtures thereof.

16. The device of claim 1, wherein all the layers may independently be formed by ion beam deposition.

17. The device of claim 7, wherein all the layers may independently be formed by ion beam deposition.

* * * * *